US007560052B2

(12) United States Patent
Enciu et al.

(10) Patent No.: US 7,560,052 B2
(45) Date of Patent: Jul. 14, 2009

(54) SILVER INK COMPOSITIONS CONTAINING A CATIONIC STYRENE/ACRYLATE COPOLYMER ADDITIVE FOR INKJET PRINTING

(75) Inventors: Billie Jo Enciu, Lexington, KY (US); Elaine Yeap Money, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 11/693,964

(22) Filed: Mar. 30, 2007

(65) Prior Publication Data

US 2008/0236444 A1 Oct. 2, 2008

(51) Int. Cl.
*H01B 1/22* (2006.01)
(52) U.S. Cl. ..................... 252/514; 106/1.19
(58) Field of Classification Search ................ 252/514; 106/31.92, 1.19
See application file for complete search history.

(56) References Cited

U.S. PATENT DOCUMENTS

| | | | |
|---|---|---|---|
| 4,880,599 A | 11/1989 | Charles et al. | |
| 5,250,229 A | 10/1993 | Hara et al. | |
| 6,551,729 B2 | 4/2003 | Taira et al. | |
| 2004/0127626 A1 | 7/2004 | Yoshiko et al. | |
| 2004/0191641 A1* | 9/2004 | Ray et al. | 430/5 |
| 2007/0144305 A1* | 6/2007 | Jablonski et al. | 75/252 |
| 2008/0182090 A1* | 7/2008 | Rouse et al. | 428/208 |
| 2008/0193667 A1* | 8/2008 | Garber et al. | 427/532 |

* cited by examiner

*Primary Examiner*—Mark Kopec
(74) *Attorney, Agent, or Firm*—Taylor & Aust, PC

(57) ABSTRACT

The present invention provides an aqueous ink containing ≧3% silver particles having much improved adhesion. It has been found that the adhesion can be improved by adding an aqueous cationic dispersion of a styrene/acrylate copolymer, PEI (polyethyleneimine), or arabinogalactan as an additive to the ink. The advantage of using one of these materials to improve the adhesion of the silver ink is the stability of the ink is maintained and the resistivity goal is met when printed onto the specified media. In other words, this invention provides a silver ink with great adhesion properties while still able to meet the <0.1 Ω/square resistivity requirement and remain stable for up to 4 weeks at 60° C. at accelerated oven aging conditions.

7 Claims, 1 Drawing Sheet

SILVER INK COMPOSITIONS CONTAINING A CATIONIC STYRENE/ACRYLATE COPOLYMER ADDITIVE FOR INKJET PRINTING

FIELD OF THE INVENTION

This invention pertains to an aqueous silver inkjet ink having improved adhesion to media while meeting resistivity, jetting, and stability requirements.

BACKGROUND OF THE INVENTION

Silver nanoparticles dispersed in polymer resin are formulated to make conductive ink which is used for printing of electrical elements such as, electroluminescent (EL) displays, radio frequency identification (RFID), multi-layer circuits and membrane circuit applications. Based on its application, silver ink is printed on different types of media. For example for EL display and RFID applications, it is printed on a porous media. For application of multi-layer circuits and membrane circuit application, it is printed on FR4 board (coated with ink receiving layer) and PET transparency, respectively.

Thermal inkjet printing to which this invention relates is now widely practiced in conventional printing. It involves the intense heating of an aqueous ink in a small amount in contact with a heating element so that the ink is vaporized. The vaporized ink, including solids in the ink, is expelled through a nozzle and thereby directed to an intended substrate.

The objective of formulating silver ink is to provide an ink which has <0.1 ohm per square resistivity, adheres well to media, remains stable up to 1 year shelf life and jets properly in an unmodified black ink cartridge such as Lexmark Black Irk Cartridge #32. Conductive ink with such properties is necessary to produce functional electrical elements.

A previous study by Applicants indicated that at least 11% silver loading is required to obtain <0.1 ohm/sq resistivity after <200° C. sintering process in an oven. The solid loading for conductive ink is very high when compared to traditional pigment or dye inks. To obtain stability, silver dispersion is comprised of finely dispersed silver particles in polymer systems. There are available silver dispersions such as Fine Sphere SVW102 provided by Nippon Paint Co., LTD.

One of the common issues with printed silver ink is its adhesion on the media. Sintered silver traces become powdery and flake off easily from the media. Extra care is needed to handle printed silver traces since they are easily scratched and smeared. The polymer/dispersant in the silver dispersion is not only providing good stability, but sometimes can potentially improve adhesion of the silver particles onto media. However, there is usually a trade off for good adhesion and poor conductivity. As silver particles are dispersed in a higher amount of polymer/dispersant, adhesion is improved but resistivity becomes much worse (i.e., above 0.1 ohm per square).

It would be beneficial to be able to provide high silver loading inks with improved adhesion to media while continuing to meet the <0.1 ohm per square resistivity goal when printed using a commercially available printhead such as Lexmark Black Ink Cartridge #32.

SUMMARY OF THE INVENTION

The present invention provides an aqueous inkjet ink composition for ink jet printers comprising silver particles, an additive for improving adhesion, and an aqueous carrier. In particular, the ink contains ≧3% silver solids and has improved adhesion which can be used reliably for printing of silver traces to obtain desired conductivity on printed media. The additive type/loading described below results in ink with a much improved adhesion on printed media which can be used to reliably print silver traces with a desired conductivity.

In a preferred embodiment, the silver ink of the present invention contains an additive for improving adhesion selected from the group consisting of cationic dispersions of styrene-acrylic ester copolymers, polyethyleneimine (PEI), and arabinogalactan. Examples of preferred additive materials include: Cartacoat B750 Liquid, an aqueous cationic dispersion of styrene/acrylate copolymer, manufactured by Clariant, PEI having an average molecular weight of ~800, and arabinogalactan.

Applicants have discovered that there is an optimum level of additive loading in the ink to improve on adhesion without sacrificing conductivity and/or stability of the silver ink. The preferred loading for the particular additive depends on the additive type.

The aqueous carrier medium used in the silver ink compositions of the present invention comprises water (preferably deionized water). The aqueous carrier may further comprise a humectant such as a water soluble organic solvent. Selection of a suitable water miscible solvent depends on the requirements of the specific application involved.

All percentages and ratios, used herein, are "by weight" unless otherwise specified. All molecular weights, used herein, are weight average molecular weights unless otherwise specified. Further details and advantages of the present invention are set forth below in the following more detailed description.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Figure 1:
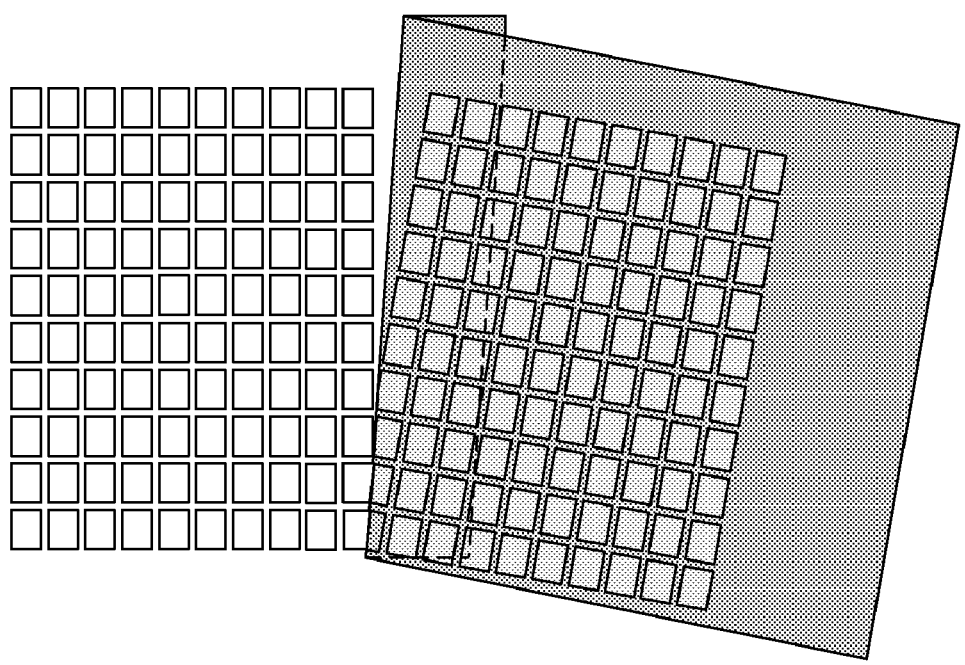
FIG. 1 shows the tape adhesion of control silver ink, Silver1, on Pictorico Paper.

The exemplifications set out herein illustrate one preferred embodiment of the invention, in one form, and such exemplifications are not to be construed as limiting the scope of the invention in any manner.

DETAILED DESCRIPTION OF THE INVENTION

This invention provides a silver ink ≧3% silver solids with much improved adhesion to media while continuing to meet the less than 0.1 ohm per square resistivity goal. The additive type/loading described below results in ink with a much improved adhesion on printed media which can be used to reliably print silver traces with a desired conductivity.

There are available stable silver dispersions such as Fine Sphere SVW102 provided by Nippon Paint Co., LTD, and AG400 247360W-1 ID087 provided by Cima NanoTech.

The silver ink of the present invention has a ≧3% silver and up to 30% silver by weight of the weight of the ink. Preferred embodiments of a silver ink will have from about 11% silver to about 27% silver, more preferably from about 12% silver to about 20% silver by weight of the weight of the ink.

The particle size (diameter) of the silver would typically be less than 50 nanometers (nm) for the best resolution and minimal settling. Particle sizes between about 15 nm to about 50, more preferably between about 20 to 42 nm are generally preferred for the same reasons. An upper limit to prevent excess settling is about 132 nm.

It should be understood however, that some settling may be tolerable as the printing of metal particles is often done in a controlled environment, such as a factory, where the ink can be readily stirred or settling otherwise reversed.

This invention provides a silver ink with much improved adhesion to media while continuing to meet the less than 0.1 ohm per square resistivity goal when printing the same amount of ink onto the media. Applicants' goal is to improve tape adhesion of silver ink on printed media to at least 80% (80% area of image permanence after tape test). It has been found that the adhesion of silver ink can be improved by the use of an additive selected from the group consisting of cationic dispersions of styrene-acrylic ester copolymers, polyethyleneimine (PEI), and arabinogalactan.

An example of a preferred cationic dispersion of styrene-acrylic ester copolymer additive material is Cartacoat B750 Liquid (an aqueous cationic dispersion of styrene/acrylate copolymer, manufactured by Clariant) with 30% solids, and a Tg of 50° C. Preferably, the aqueous inkjet ink compositions comprise from about 0.1 to about 3% by weight, more preferably from 0.2 to about 1.0% by weight of the cationic dispersions of styrene-acrylic ester copolymer additive, based on the weight percentage of the styrene/acrylate copolymer solids in the aqueous inkjet ink composition.

Another preferred additive material for improving adhesion is polyethyleneimine (PEI). PEI has the chemical formula: $(CH_2CH_2NH)n$. PEI can be purchased from companies such as Sigma-Aldrich, Alfa Aesar, etc. Preferably the PEI has an average molecular weight of from about 400 to about 1200, more preferably an average molecular weight of about 800. The aqueous inkjet ink compositions preferably comprise from about 0.1 to about 1.0% by weight of the polyethyleneimine additive.

Yet another preferred additive material for improving adhesion is arabinogalactan. Arabinogalactan is a water-soluble polysaccharide extracted from the timber of western larch trees. It is a complex highly branched polymer of arabinose and galactose. Arabinogalactan is manufactured by a variety of manufacturers including Sigma-Aldrich, Lonza Inc., Larex Inc., etc. The aqueous inkjet ink compositions preferably comprise from greater than about 3% to less than about 5% by weight of the arabinogalactan additive.

The aqueous carrier medium used in the silver ink compositions of the present invention comprises water (preferably deionized water). The aqueous carrier may further comprise a humectant such as a water soluble organic solvent. Selection of a suitable water miscible solvent depends on the requirements of the specific application involved. Representative examples of water soluble organic solvents that may be selected include (1) alcohols, such as methyl alcohol, ethyl alcohol, n-propyl alcohol, isopropyl alcohol, n-butyl alcohol, sec-butyl alcohol, t-butyl alcohol, iso-butyl alcohol, furfuryl alcohol, and tetrahydrofurfuryl alcohol; (2) ketones or ketoalcohols, such as acetone, methyl ethyl ketone and diacetone alcohol; (3) ethers, such as tetrahydrofuran and dioxane; (4) esters, such as ethyl acetate, ethyl lactate, ethylene carbonate and propylene carbonate; (5) polyhydric alcohols, such as ethylene glycol, diethylene glycol, triethylene glycol, propylene glycol, tetraethylene glycol, polyethylene glycol, glycerol, 2-methyl-2,4-pentanediol, 1,2,6-hexanetriol and thiodiglycol; (6) lower alkyl mono- or di-ethers derived from alkylene glycols, such as ethylene glycol monomethyl (or monoethyl)ether, diethylene glycol monomethyl (or monoethyl)ether, propylene glycol monomethyl (or monoethyl) ether, triethylene glycol monomethyl (or monoethyl)ether and diethylene glycol dimethyl (or diethyl)ether; (7) nitrogen-containing cyclic compounds, such as pyrrolidone, N-methyl-2-pyrrolidone, and 1,3-dimethyl-2-imidazolidinone; and (8) sulfur-containing compounds, such as dimethyl sulfoxide and tetramethylene sulfone. Other useful organic humectants include lactones and lactams. Mixtures of these humectants may be used in the present invention.

A preferred humectant set consists of a mixture of 1,2-propanediol and a glycol ethers compound having the following structure:

wherein R is a C1-C4 alkyl group and n=1 to 3. Examples of glycol ethers compounds that showed significant improvement of jetting when mixed with 1,2-propanediol include: triethylene glycol monobutyl ether, diethylene glycol mono butyl ether and triethylene glycol mono methyl ether.

Other preferred humectants include, but are not limited to, bis-hydroxy terminated thioethers, lactams, and polyalkylene glycols. The amount of humectant in an ink formulation can range from 0 to 40%, preferably from 15 to 30% by weight of the weight of the ink.

There is an optimum level of humectant loading in the ink to improve on jetting without sacrificing conductivity of the silver ink. For a high solids ink, increasing humectant loading will increase ink viscosity. It is best to maintain ink viscosity under 5 cP. In addition to affecting ink viscosity, increasing humectant loading can hurt adhesion of silver ink to media.

Surfactants can be added to the silver ink to decrease dry time and increase wetting of ink on media. The affinity of surfactant to the silver particle can affect stability and jetting. A study was carried out to evaluate the surfactant type by varying the HLB value of the Surfynol series surfactant from Air Products. In the same study, the surfactant loading was varied from 0 to about 2%. From the ethoxylated diols group of surfactant tested in the study, 1% of Surfynol 465 was preferred for optimum jetting and stability. Surfynol 465 is an ethoxylated 2,4,7,9-tetramethyl 5 decyn-4,7-diol.

Biocides, such as for example, 1,2-benz-isothiazolin-3-one, sold commercially as PROXEL GXL, may be added to the ink to prevent or inhibit growth of microorganisms in the ink. Generally, the addition of from about 0.1 to about 0.2% by weight of a biocide will be effective in reducing the gram positive and negative bacteria as well as mold growth.

EXAMPLES

The following examples are detailed descriptions of methods of preparation and use of the aqueous silver ink compositions of the present invention. The detailed descriptions fall within the scope of, and serve to exemplify, the more general description set forth above. The examples are presented for illustrative purposes only, and are not intended as a restriction on the scope of the invention.

The following inks contain DI water, 14% silver, and additive type and level listed in Table 1. The silver dispersion used in these inks was Fine Sphere SVW102 provided by Nippon Paint Co., LTD. Ink particle sizes ranged from 20 nm to 42 nm.

Initial material screening began with draw downs of the ink onto Pictorico paper. Using a pipette, 3 drops of ink were placed on the paper. A 5 mm diameter stainless steel rod was then used to smear the ink across the page. The paper was then sintered or annealed in an oven up to 150° C. for 30 minutes.

A 10×10 grid was then placed on top of the sintered ink and, using a razor blade, the lines were lightly traced into the silver ink. Next, a PCB Blue Cruiser Tape (purchased from IPS Limited Co.) was placed over the sintered ink where the grid had been traced while applying pressure. The tape was then removed with medium speed to determine the adhesion of silver ink to the media. The adhesion was graded by % area left on the paper after the tape was removed. If the tape removes 10% of the grids, adhesion equals 90%. If a material improved the adhesion of the silver ink, the improved ink then moved onto a second phase of testing and was also monitored for stability.

The second phase of material screening consisted of testing the adhesion of the ink in a printed sample. Silver ink was filled into an unmodified Lexmark Black Ink Cartridge #32. A Lexmark Z816 printer and an internally developed driver (places 2× ink, 720,069 dots/sq.in) was used to print a 10×10 test grid. Pictorico Premium Glossy Paper was chosen as the media since it is one of the best media for conductivity. Printed samples were sintered or annealed in an oven up to 150° C. Next, the PCB Blue Cruiser Tape was again used in the same manner as described in the draw down method to test the adhesion of the printed silver ink on paper. A comparison of the samples prepared by the draw down method versus printing method shows that adhesion is slightly worse for a printed sample. However, the draw down method was used for the majority of the tests as a quick screening method to look for materials to improve adhesion. Reported resistivity measurements are based on printed samples.

Figure 2:
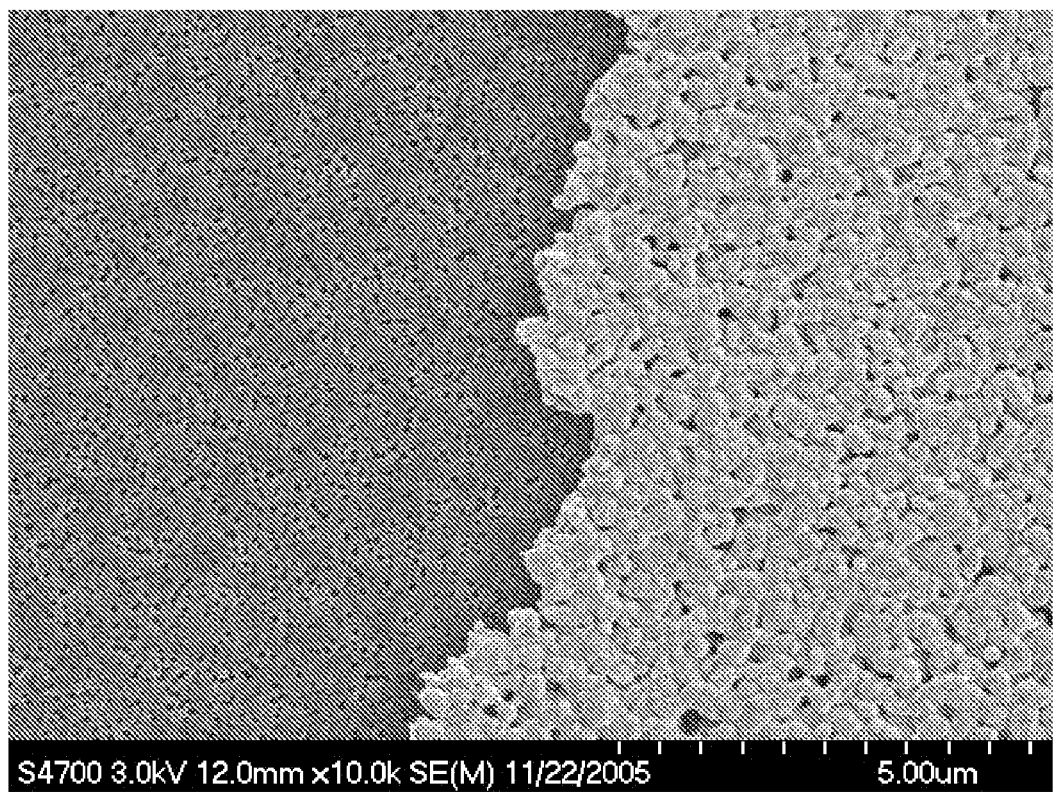
FIG. 2 shows a SEM picture of the tape tested area of control silver ink, Silver1, on Pictorico Paper.

A control silver ink, Silver1, was printed on the Pictorico Paper, annealed in a 150° C. oven, and then tested for adhesion. FIG. 1 shows the tape adhesion test results where 100% of the ink was lifted from the paper using the blue tape, resulting in 0% adhesion. The sample was submitted for SEM analysis. FIG. 2 is an SEM Picture of the tape tested area on the Pictorico Paper showing the failure mode of the adhesion test as adhesive failure.

A series of acrylic and cationic additives were added to the silver ink and the adhesion test repeated. Table 1 below shows 4 different materials that were tested as additives in the ink and greatly improved its adhesion. However, only one of these materials proved to maintain stability in the silver ink. Stability of the silver ink was determined by monitoring its particle size growth while the ink is aged by placing it in a 60° C. oven up to 4 weeks. If particle size increases over 100 nm after oven aging, the ink is considered unstable. Cartacoat B750 Liquid was chosen as an additive to the silver ink since it provided great adhesion improvement and maintained stability in the ink.

Besides additive materials, the amount of dispersant added to the ink was tested for adhesion as well. The polymer dispersant G that was used for the test is an acrylic polymer dispersant comprising a random copolymer of methacrylic acid and polyethylene glycol methacrylate. Table 2 below shows that adding dispersant to silver ink improves adhesion slightly but resistivity become worse.

TABLE 2

Amount of Dispersant G Added to Ink vs Resistivity and Adhesion

| % Dispersant added | 0 | 0.3 | 1.4 | 5 |
|---|---|---|---|---|
| Resistivity ($\Omega/\square$) | 0.06 | 0.06 | 0.06 | 0.15 |
| Adhesion | 0% | 2% | 10% | 20% |

Another experiment was carried out to test other dispersant types that are commercially available. The results in Table 3 below show that these dispersants only slightly improved the adhesion of the silver ink.

TABLE 3

Different Type of Dispersant Added to Ink vs Tape Adhesion

| Dispersant type | Disperbyk 190 | Disperbyk 191 | Joncryl 60 | Joncryl 693 | Joncryl 678 |
|---|---|---|---|---|---|
| Loading (%) | 0.5 | 0.4 | 0.3 | 1.0 | 1.0 |
| % Adhesion | 20% (draw down) | 0% | 10% (draw down) | <50% | 0% |

Another material that was tested and improved the adhesion in the silver ink is PEI (polyethyleneimine), with an average molecular weight of ~800. Table 4 below shows that silver ink with PEI not only exhibits improved adhesion, but also continues to meet the <0.1$\Omega/\square$ resistivity requirement.

TABLE 4

PEI Additive for Tape Adhesion and Resistivity

| Ink | Control Ink | Exp. Ink |
|---|---|---|
| % PEI | 0 | 0.2 |
| % Adhesion | 0% | 90% |
| Resistivity ($\Omega/\square$) | 0.06 | 0.07 |

Another additive material found to improve adhesion in the silver ink is arabinogalactan. Table 5 shows the improvement in adhesion, however the resistivity was affected when added up to 5% by weight in the ink. There may be an optimum level for adhesion and resistivity for this material, however there was not an ink tested at 4% loading.

TABLE 1

Adhesion and Stability Results with Additive in Inks

| Additive | Chemistry | Loading | Stability | Adhesion | Resistivity ($\Omega/\square$) |
|---|---|---|---|---|---|
| Acrylic binder A | BA, MAA; 50T$_G$ with SSA[1] | 0.3% | Unstable | >80% draw down | — |
| Acrylic binder B | BA, MAA; 50T$_G$ no SSA[1] | 0.3% | Unstable | >80% draw down | — |
| Cartacoat B750 | Styrene acrylate copolymer | 0.5% | Stable | >80% | 0.079 |
| Cartacoat K303 | cationic binder | 0.5% | Unstable | >80% draw down | — |
| none, control1 | — | — | Stable | 0% | 0.057 |
| none, control2 | — | — | Stable | 0% draw down | — |

[1]BA = Butyl Acrylate; MAA = Methacrylic acid; SSA = Styrene Sulfonic acid; T$_G$ = glass transition temperature

TABLE 5

Arabinogalactan Loading vs Adhesion and Resistivity

|  | Control Ink | Exp2 Ink | Exp3 Ink |
| --- | --- | --- | --- |
| % Arabinogalactan | 0% | 3% | 5% |
| Adhesion | 0% | 40% | 99% |
| Resistivity ($\Omega/\square$) | 0.060 | 0.087 | 0.132 |

A long list of humectants were tested in ink formulations for adhesion improvement. Humectant materials which showed no improvement in tape adhesion include: 1,2-butanediol, 1,3-butanediol, 2,3-butanediol, 1,2-propanediol, 1,3-propanediol, 2-methyl-2,4-pentanediol, glycerol, 2-pyrrolidone, 2,2-thiodiethanol, tetraethylene glycol, triethylene glycol monobutyl ether, diethylene glycol mono butyl ether, triethylene glycol mono methyl ether, triethylene glycol monobutyl ether, POE 20 sorbitan monolaurate, maltitol and maltose monohydrate.

Lastly, a series of Surfynol surfactants were tested for adhesion. Applicants found that Surfynol 2502, FS80, 465 and 485 (with HLB value ranging 7.8 to 17) added from 0.1 to 1.5% in the ink did not affect adhesion in silver ink.

In summary, the purpose of this invention is to provide a silver ink with much improved adhesion. It has been found that the adhesion can be improved by adding cationic dispersions of styrene-acrylic esters copolymers such as Cartacoat B750 Liquid, PEI (polyethyleneimine), or arabinogalactan as an additive to the ink. The advantage of using one of these materials to improve the adhesion of the silver ink is that the stability of the ink is maintained and the resistivity goal is met when printed onto the specified media. In other words, this invention provides a silver ink with great adhesion properties while able to meet the <0.1 $\Omega$/square resistivity requirement and remain stable for up to 4 weeks at 60° C. at accelerated oven aging conditions.

While this invention has been described with respect to embodiments of the invention, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An aqueous inkjet ink composition for ink jet printers comprising silver particles having diameter in the range of from about 15 nm to about 50 nm, a cationic dispersion of a styrene/acrylate copolymer as an additive for improving adhesion, a humectant mixture, a surfactant, an aqueous carrier, wherein said cationic dispersion of styrene/acrylate copolymer is present in an amount of from about 0.1 to about 3% by weight based on the weight percentage of the styrene/acrylate copolymer solids in the aqueous inkjet composition.

2. The aqueous inkjet ink of claim 1 wherein said aqueous inkjet comprises from about 0.2 to about 1.0% by weight of said additive, based on the weight percentage of the styrene/acrylate copolymer solids in the aqueous inkjet ink.

3. The aqueous inkjet ink of claim 1 wherein said aqueous inkjet ink comprises from $\geqq$3% to about 30% of the silver particles.

4. The aqueous inkjet ink of claim 3 wherein said aqueous inkjet ink comprises from about 11% to about 27% of the silver particles.

5. The aqueous inkjet ink of claim 4 wherein said silver particles have a diameter in the range of from about 20 nm to about 42 nm.

6. The aqueous inkjet ink of claim 1 wherein said surfactant is ethoxylated 2,4,7,9-tetramethyl 5 decyn-4,7-diol.

7. The aqueous inkjet ink of claim 1 wherein said humectant comprises a mixture of 1,2-propanediol and a glycol ethers compound having the following structure: R—[OCH$_2$CH$_2$]$_n$—OH wherein R is a C1-C4 alkyl group and n=1 to 3.

* * * * *